(12) United States Patent
Ootori et al.

(10) Patent No.: US 6,516,867 B1
(45) Date of Patent: Feb. 11, 2003

(54) HEAT SINK MANUFACTURING DEVICE AND MANUFACTURING METHOD

(75) Inventors: Yasuhiro Ootori, Kanagawa (JP); Chiyoshi Sasaki, Kanagawa (JP)

(73) Assignee: Sony Computer Entertainment Inc., Tokyo (JP)

( * ) Notice: Subject to any disclaimer, the term of this patent is extended or adjusted under 35 U.S.C. 154(b) by 0 days.

(21) Appl. No.: 09/656,650

(22) Filed: Sep. 7, 2000

(30) Foreign Application Priority Data

Sep. 10, 1999 (JP) .......................................... 11-256934

(51) Int. Cl.$^7$ ............................................... B22D 17/00
(52) U.S. Cl. ....................................... 164/137; 164/342
(58) Field of Search .................................. 164/137, 113, 164/120, 319, 320, 339, 342, 312

(56) References Cited

U.S. PATENT DOCUMENTS

| | | |
|---|---|---|
| 3,575,233 A | 4/1971 | Mahle et al. |
| 3,595,301 A | 7/1971 | Bauer |
| 4,824,351 A | 4/1989 | Ramsey |
| 5,215,140 A | 6/1993 | Beane |
| 5,562,146 A * | 10/1996 | Harmon et al. ............. 164/112 |
| 5,832,983 A | 11/1998 | Kuroda et al. |
| 6,085,830 A * | 7/2000 | Mashiko et al. ............ 165/80.3 |
| 6,257,314 B1 * | 7/2001 | Kuo ........................... 164/342 |

FOREIGN PATENT DOCUMENTS

JP    2000-263210    *    9/2000    ............ B22D/17/22

* cited by examiner

Primary Examiner—M. Alexandra Elve
Assistant Examiner—Kevin P. Kerns
(74) Attorney, Agent, or Firm—Katten Muchin Zavis Rosenman

(57) ABSTRACT

A device and method for manufacturing a heat sink that has a base and heat radiating fins of various shapes and has a prescribed strength, high heat-radiating efficiency, and whose base and heat-radiating fins are formed integrally. The heat sink manufacturing device includes a die casting machine which has the cavity for a base and heat-radiating fins, and which includes a fixed mold, a movable mold that can move in the vertical or up-down direction, and a slide mold that can move in the horizontal direction.

10 Claims, 5 Drawing Sheets

HEAT SINK MANUFACTURING DEVICE AND MANUFACTURING METHOD

FIELD OF THE INVENTION

The present invention relates to a manufacturing device and manufacturing method for a heat sink that has a base and heat-radiating fins. The heat sink that has base and heat-radiating fins and that is manufactured by the manufacturing device and manufacturing method of this invention can be used not only for heat sinks for the heat radiation and cooling of heat-generating electronic components used in electronic devices, but also for heat-radiation cooling in all fields that require heat dissipation.

BACKGROUND OF THE INVENTION

The ever smaller size and higher degree of integration of the semiconductor chips used in computers, game machines, audio equipment, and other electronic devices have led to much faster processing, and with it a very high heat generation density. Heat sinks in which a base and heat-radiating fins are formed integrally are widely used as a means for dissipating the heat that is emitted by personal computers, game machines, audio equipment, and other electronic devices that have semiconductor chips or other components whose heat generation density has thus increased. In a heat sink constructed with a base and heat-radiating fins formed integrally, weight can be reduced and the heat-radiating surface can be increased.

The manufacturing method and manufacturing device for manufacturing heat sinks in which the base and heat-radiating fins are formed integrally are shown in FIG. 2 which diagrammatically shows a conventional device for manufacturing heat sinks. FIG. 1 shows a heat sink 31 manufactured by a conventional manufacturing device. FIG. 3 is an enlarged view of the fins of a heat sink manufactured by a conventional manufacturing device.

Die cast 34 shown in FIG. 2 consists of a fixed mold 36 and a movable mold 35. Mold 35 moves in the vertical direction and a cavity 37 which consists of a cavity 39 for the base and a cavity 38 for the heat-radiating fins. Movable mold 35 can move up and down as indicated by arrow C in the diagram of FIG. 2.

In heat dissipation using a heat sink in which a base and heat-radiating fins are formed integrally, the heat emitted by the heat source is first received by the thermally conductive base, then the heat from the heat source is dissipated by the heat-radiating fins that are provided adjacent to and integrally with the thermally conductive base that receives the heat.

But with a conventional manufacturing device, if the heat sink is formed integrally so that in the diecast the heat-radiating fins are perpendicular to the base, the height of the fins, the spacing between them, and other conditions of the shape of the fins are subject to constraints, which presents the problem that fins that have adequate heat dissipation effect cannot be obtained. That is, when molten metal is injected into cavity 37 and the heat sink is formed integrally, when removing the movable mold that is positioned above the fixed mold and moves up and down in the direction of arrow C, if the height exceeds the prescribed height, cracking and other damage to the fins occurs, making it difficult to manufacture an integrally formed heat sink.

The spacing between fins becomes large if, in order to make it easy to remove the movable mold, each fin 33 of the heat-radiating fins integrally formed at the end of base 32 is formed with a prescribed taper angle so that its width narrows toward its tip. Moreover, making the fins longer creates the problem that the strength of the heat-radiating fins is reduced. Because the movable mold is pulled out upwards after the heat sink has been formed, there is the problem that it is impossible to form on the heat-radiating fins any parts along the direction perpendicular to the direction in which the movable mold moves.

SUMMARY OF THE INVENTION

It is therefore an object of the present invention to provide a manufacturing device and a manufacturing method for a heat sink that has fins of various shapes, and also has the prescribed strength, high heat-radiating efficiency, and whose base and heat-radiating fins are formed integrally.

The inventors have carried out much diligent research in order to solve the above-identified previous problems. As a result, they have learned that, by combining a fixed mold, a movable mold that can move in the up-down direction (the first direction), and a slide mold that can move in the horizontal direction (the second direction), one can, manufacture a heat sink that has fins of various shapes, has the prescribed strength, has high heat-radiating efficiency, and whose base and heat-radiating fins are formed integrally. That is, by forming the mold split in the up-down and horizontal directions, using for the base a fixed mold and a movable mold that can move in the up-down direction and splitting the mold into a top and bottom, and using for the heat-radiating fins a fixed mold and a movable mold that can move in the up-down direction (the first direction) and a slide mold that can move in the horizontal direction (the second direction), one can manufacture a heat sink which can have fins of various shapes, have superior heat-radiating efficiency, and whose base and heat-radiating fins are formed integrally.

By pulling out the mold in the side direction of the fins of the heat-radiating fins horizontally, the pullout distance becomes short, and one can prevent any fin cracking or other damage even if the fins are high and narrowly spaced. Also by pulling out the mold in the side direction of the fins of the heat-radiating fins horizontally, the fins can be given various shapes including curves, and one can manufacture a heat sink of high heat-radiating efficiency whose base and heat-radiating fins are formed integrally.

The present invention was made, based on the discovery referred to above. According to a first aspect of the present invention, a heat sink manufacturing device includes a die casting machine that has a cavity for the heat sink consisting of a base and heat-radiating fins, and the die casting machine includes a fixed mold, a movable mold that can move in the up-down direction, and a slide mold that can move in the horizontal direction.

According to a second aspect of the present invention, a heat sink manufacturing device includes a die casting machine in which the base is formed by the fixed mold and the movable mold that can move in the up-down direction, and the heat-radiating fins are formed by the fixed mold, the movable mold and the slide mold.

In a heat sink manufacturing device according to a third aspect of the present invention, the slide mold has at least two parts that extend in the horizontal direction and are separate from each other.

In a heat sink manufacturing device according to a fourth aspect of the present invention, the parts that extend in the horizontal direction and are separate from each other consist of parts of polygonal cylinder shape.

In a heat sink manufacturing device according to a fifth aspect of the present invention, the parts that extend in the horizontal direction and are separate from each other consist of at least two curved parts.

In a heat sink manufacturing device according to a sixth aspect of the present invention, the vertical cross-section of said slide mold is of a lattice shape.

In a heat sink manufacturing device according to a seventh aspect of the present invention, the vertical cross-section of said slide mold consists of multiple parallel waveform shapes.

In a heat sink manufacturing device according to an eighth aspect of the present invention, a heat sink manufactured therein has a heat pipe.

A heat sink manufacturing method according to a first aspect of the present invention includes the steps of:

a step of preparing a die casting machine that has a cavity for a heat sink which consists of a first cavity for the base of the heat sink and a second cavity for heat-radiating fins of the heat sink, and that includes a fixed mold, a movable mold that can move in the up-down direction, and a slide mold that can move in the horizontal direction, wherein a step of positioning the die casting machine so that the first cavity for the base should be formed by the fixed mold and the movable mold that can move in the up-down direction, and the second cavity for the heat-radiating fins should be formed by the fixed mold, the movable mold that can move in the up-down direction, and the slide mold, a step of injecting molten metal into the cavity and cooling the metal to the prescribed temperature, and a step of moving the movable mold up-down and moving the slide mold in the horizontal direction, to thereby manufacture the heat sink. In the heat sink manufacturing method according to a second aspect of the present invention, the slide mold may have at least two parts that extend in the horizontal direction and are separate from each other.

In the heat sink manufacturing method according to a third aspect of the present invention, the parts that extend in the horizontal direction and are separate from each other may consist of parts of polygonal cylinder shape.

In the heat sink manufacturing method according to a third aspect of the present invention, the parts that extend in the horizontal direction and are separate from each other may consist of at least two curved parts.

In the heat sink manufacturing method according to a fourth aspect of the present invention, the vertical cross-section of the slide mold may be of a lattice shape.

In the heat sink manufacturing method according to a fifth aspect of the present invention, the vertical cross-section of the slide mold may consist of multiple parallel waveform shapes.

In the heat sink manufacturing method according to a sixth aspect of the present invention, the heat sink may be manufactured to have a heat pipe.

In the heat sink manufacturing method according to a seventh aspect of the present invention, the movable mold may be moved up-down, and next, the slide mold may be moved in the horizontal direction.

In the heat sink manufacturing method according to an eighth aspect of the present invention, the slide mold may be moved in the horizontal direction, and next, the movable mold may be moved up-down.

In a heat sink according to a first aspect of the present invention, a heat sink is manufactured by a heat-sink manufacturing method having the following steps of: a step of preparing a die casting machine that has a cavity for a heat sink which consists of a first cavity for the base of the heat sink and a second cavity for heat-radiating fins of the heat sink, and that includes a fixed mold, a movable mold that can move in the up-down direction, and a slide mold that can move in the horizontal direction, wherein a step of positioning the die casting machine so that the first cavity for the base should be formed by the fixed mold and the movable mold that can move in the up-down direction, and the second cavity for the heat-radiating fins should be formed by the fixed mold, the movable mold that can move in the up-down direction, and the slide mold, a step of injecting molten metal into the cavity and cooling the metal to the prescribed temperature, and a step of moving the movable mold up-down and moving the slide mold in the horizontal direction, to thereby manufacture the heat sink.

According to a second aspect of the present invention, a heat sink is manufactured by the manufacturing method in which the slide mold has at least two parts that extend in the horizontal direction and are separate from each other.

DETAILED DESCRIPTION OF THE PREFERRED EMBODIMENTS

With reference to the drawings, the heat sink manufacturing device and manufacturing method of this invention will be now described.

The heat sink manufacturing device of the present invention has a die casting machine (FIG. 4), which has a cavity for a heat sink including a base and heat-radiating fins, and has a fixed mold, a movable mold that can move in the up-down direction, and a slide mold that can move in the horizontal direction.

Figure 1:
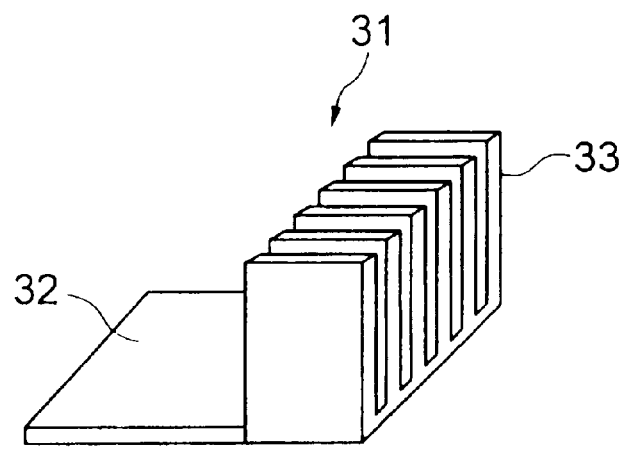
FIG. 1 is a diagram showing a heat sink manufactured by a conventional manufacturing device.
Figure 2:
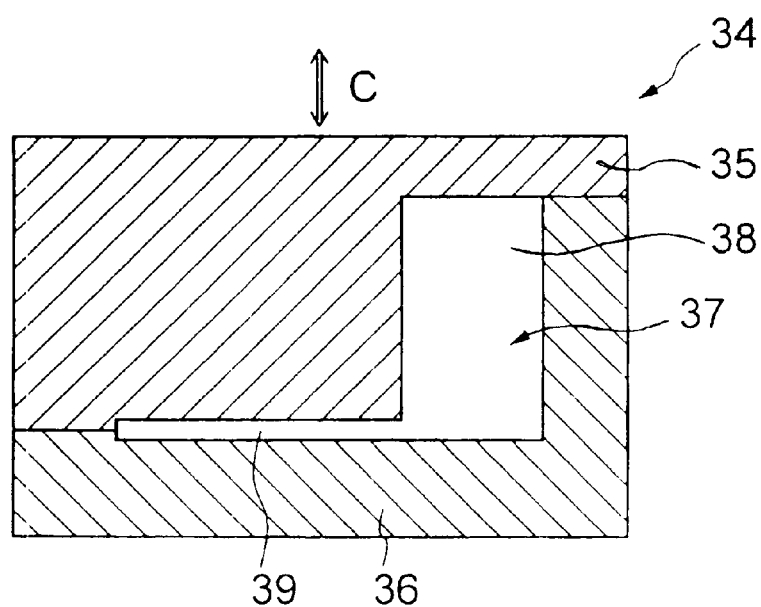
FIG. 2 is a cross-sectional view of a conventional device for manufacturing heat sinks.
Figure 3:
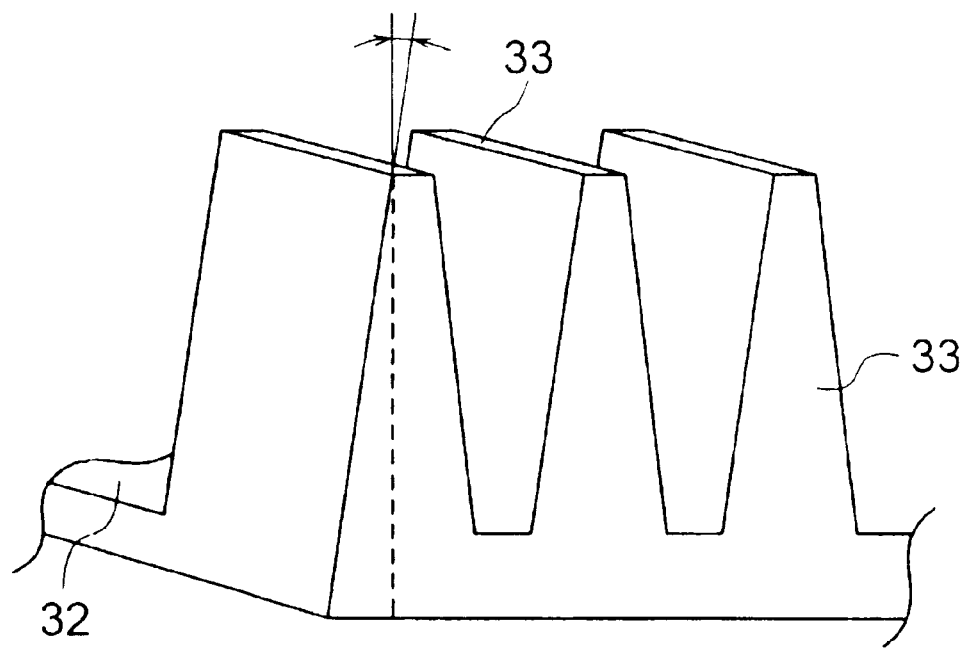
FIG. 3 is an enlarged view of the fins of a heat sink manufactured by a conventional manufacturing device.
Figure 4:
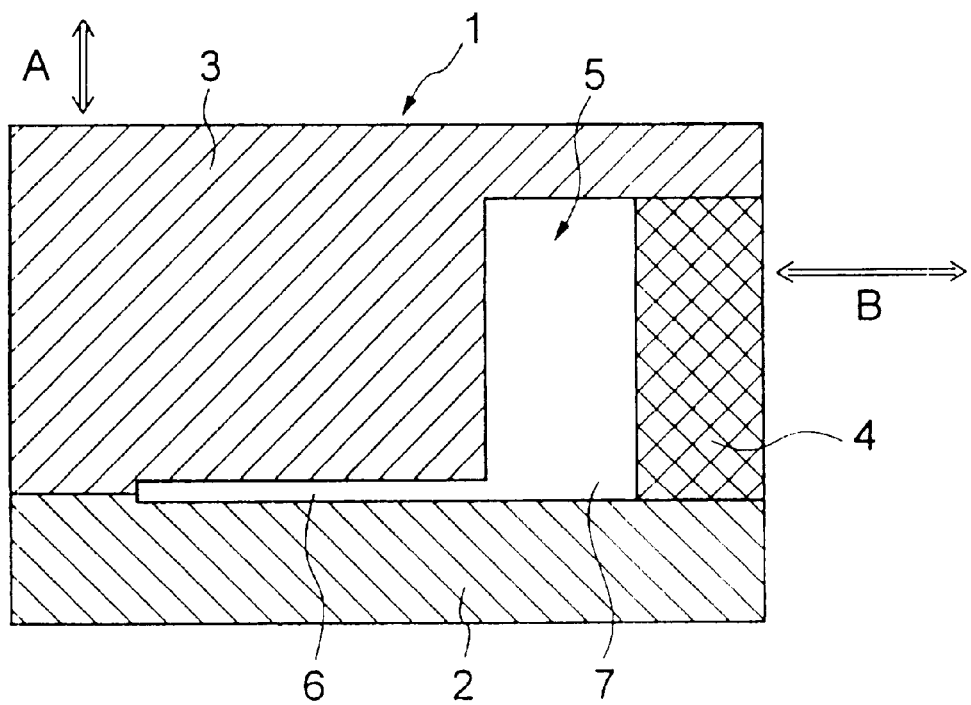
FIG. 4 is a cross-sectional view showing the heat sink manufacturing device of the present invention.

As shown in FIG. 4 showing a heat sink manufacturing device of the present invention, heat sink manufacturing device 1 consists of a fixed mold 2, a movable mold 3 that can move in the up-down direction as shown by arrows A, and a slide mold 4 which can move in the horizontal direction. Provided inside the molds is a cavity 5, which consists of first cavity 6 for the base and second cavity 7 for the heat-radiating fins. Mold 3 that can move in the up-down direction can move in the direction indicated by arrows A. Mold 4 that can move in the horizontal direction can move in the direction indicated by arrows B. Any conventional means can be used for moving molds 3 and 4, respectively.

The base is formed by the fixed mold 2 and movable mold 3 that can move in the up-down direction. The heat-radiating fins are formed by fixed mold 2, movable mold 3 that can move in the up-down direction, and slide mold 4.

The slide mold 4 according to this invention has two parts that extend in the horizontal direction and are separate from one another. That is, in the part illustrated in FIG. 4 as second cavity 7 for the heat-radiating fins, although not shown, there are at least two parts, extending horizontally and separate from each other, for forming fins of various shapes by slide mold 4.

Those parts that extend in the horizontal direction and are separate from each other may consist of parts of polygonal cylinder shape. That is, they may be in the shape of square pillars or hexagonal pillars (like the cells in a beehive). Also, those parts that extend in the horizontal direction and are separate from each other may consist of at least two curved parts. Also, the vertical cross-section of the slide mold may be of a lattice shape. Also, the vertical cross-section of the slide mold may be of multiple parallel waveform shapes.

Figure 5:
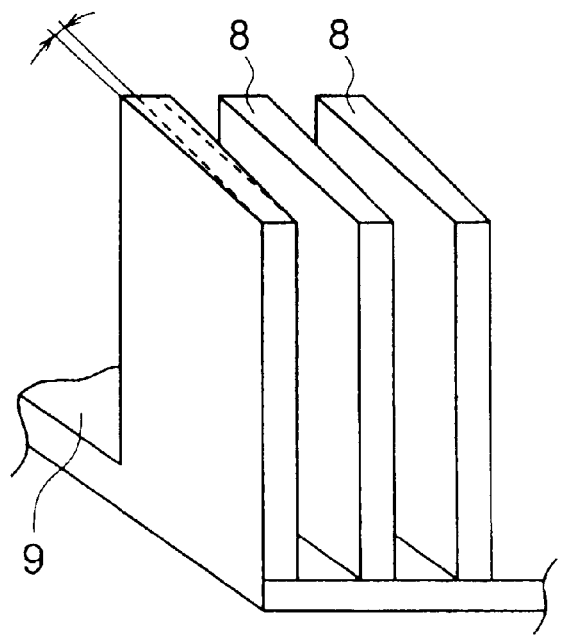
FIG. 5 shows partially a perspective view of a heat sink manufactured by an embodiment of the heat sink manufacturing device of this invention.
Figure 6:
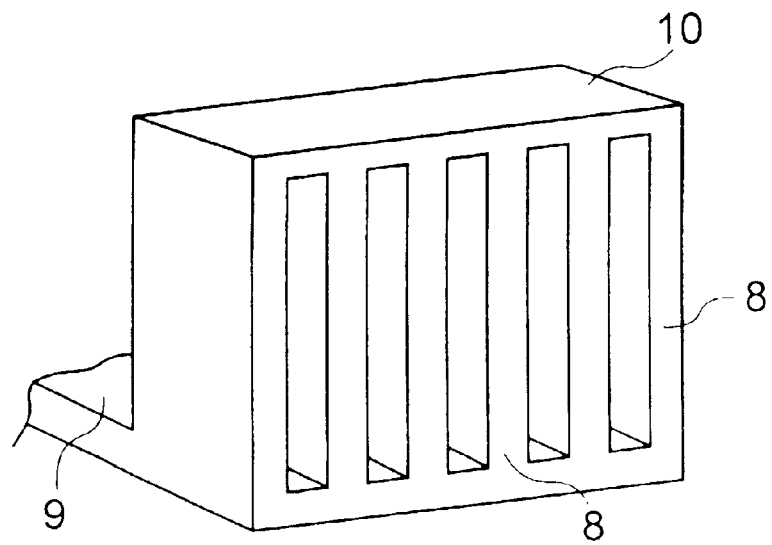
FIG. 6 is a partial perspective view of another embodiment of a heat sink manufactured by another embodiment of the heat sink manufacturing device of this invention.
Figure 7:
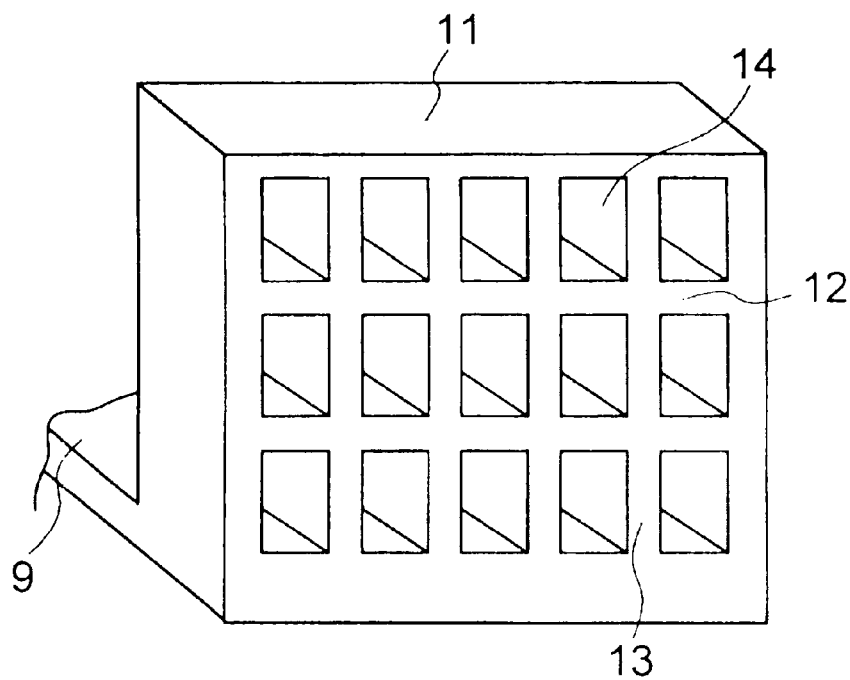
FIG. 7 is a partial perspective view of yet another embodiment of a heat sink manufactured by a still another embodiment of the heat sink manufacturing device of this invention.
Figure 8:
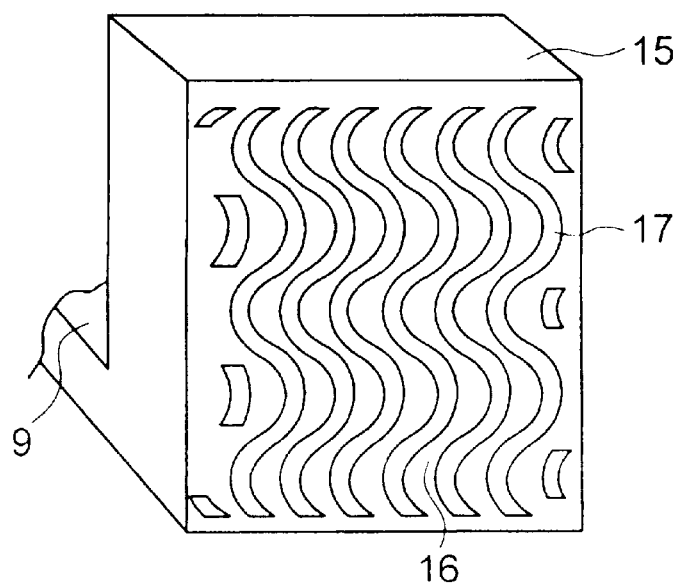
FIG. 8 is a partial perspective view showing yet another embodiment of a heat sink manufactured by the heat sink manufacturing device of this invention.

FIG. 5 shows part of a heat sink manufactured by the heat sink manufacturing device of this invention. FIG. 6 shows part of a heat sink of another embodiment, manufactured by the heat sink manufacturing device of this invention. FIG. 7 shows part of the heat sink of yet another embodiment manufactured by the heat sink manufacturing device of this invention, and FIG. 8 shows a further embodiment of the heat sink manufactured by the heat sink manufacturing device of this invention.

For forming the heat-radiating fins, the slide mold is pulled out in the side direction, that is, horizontally in the fins' depth (side) direction. As shown in FIG. 5, heat-radiating fins 8 may be formed so as to have high fins and closely spaced from one another and have a large heat-radiating area. In order to make it easy to pull out the slide mold in the horizontal direction, a taper angle may be provided, indicated by the angle shown by the dotted lines in FIG. 5, so that the fins are made wider toward a base 9.

The parts of the slide mold that extend horizontally and are separate from each other may be shaped so that the heat-radiating fins formed at the end of base 9 have fins 8 and a top 10, as shown in FIG. 6. Providing top 10 on the heat-radiating fins greatly increases the strength of the heat-radiating fins.

The parts of the slide mold that extend horizontally and are separate from each other may consist of multiple square pillar-shaped parts 14, and, as shown in FIG. 7, the heat-radiating fins formed at the end of base 9 may be shaped in a lattice consisting of horizontal fins 12 and vertical fins 13 and having a top 11. By forming in the heat-radiating fins horizontal fins 12, vertical fins 13, and top 11, the strength of the heat-radiating fins is greatly increased, the surface area of the fins is made larger, and the heat-radiating efficiency is markedly increased.

The parts of the slide mold that extend horizontally and are separate from each other may consist of multiple curved parts, that is, waveform parts, and, as shown in FIG. 8, the heat-radiating fins formed at the end of base 9 may consist of fins 16 and be shaped so as to be waveform fins having a top 15. Formed between adjacent waveform fins 16 are gaps 17. Because multiple waveform fins are formed parallel to each other and integrally within a square frame, the strength of the heat-radiating fins is greatly increased, the surface area of the fins is made even larger, and the heat-radiating efficiency is markedly increased.

To provide the heat sink, which has a heat pipe, one may use a mold that has, for example, a groove where the heat pipe is to be placed in the rear surface of the base. The heat pipe is placed so as to extend from the heat-absorbing part of the base to the heat-radiating fins.

Also, it should be noted that, though not described in detail, conventionally known members may be provided, such as a sleeve for supplying molten metal, a device for letting out gas, and other diecast parts.

Next, referring to FIG. 4, the heat sink manufacturing method of this invention will be described.

The heat sink manufacturing method of the invention consists of the following steps. The die casting machine 1 is prepared that has cavity 5 for the heat sink consisting of first cavity 6 for the base and second cavity 7 for the heat-radiating fins, and also has fixed mold 2, movable mold 3 that can move in the up-down direction, and slide mold 4 that can move in the horizontal direction as described above. The molds are operated such that first cavity 6 for the base is formed by fixed mold 2 and movable mold 3 that can move in the up-down direction, and second cavity 7 for the heat-radiating fins is formed by fixed mold 2, movable mold 3 that can move in the up-down direction, and slide mold 4. In the method, molten metal is injected into cavity 7 and is cooled to the prescribed temperature, and then movable mold 3 is moved up-down as indicated by arrows A and slide mold 4 is moved in the horizontal direction as indicated by arrows B, manufacturing the heat sink.

In doing so, one may first move movable mold 3 up-down as indicated by arrows A, and next move slide mold 4 in the horizontal direction as indicated by arrows B, or one may first move slide mold 4 in the horizontal direction as indicated by arrows B, and next move movable mold 3 as indicated by arrows A.

The slide mold may have at least two parts that extend in the horizontal direction and are separate from each other. Those parts that extend in the horizontal direction and are separate from each other may consist of a parts of a polygonal cylinder shape. Those parts that extend in the horizontal direction and are separate from each other may consist of at least two curved parts. The vertical cross-section of said slide mold may consist of a lattice shape. The vertical cross-section of said slide mold may consist of multiple parallel waveform shapes.

The heat sink of this invention is manufactured by the above-described heat sink manufacturing method.

The height of the heat-radiating fins of the heat sink manufactured by the heat sink manufacturing device and manufacturing method of this invention is set to 40 mm or more, and the spacing between the fins is set to 3 mm or less.

In the following, the heat sink manufacturing device and manufacturing method of this invention will be described in detail by way of an inventive example.

Figure 9:
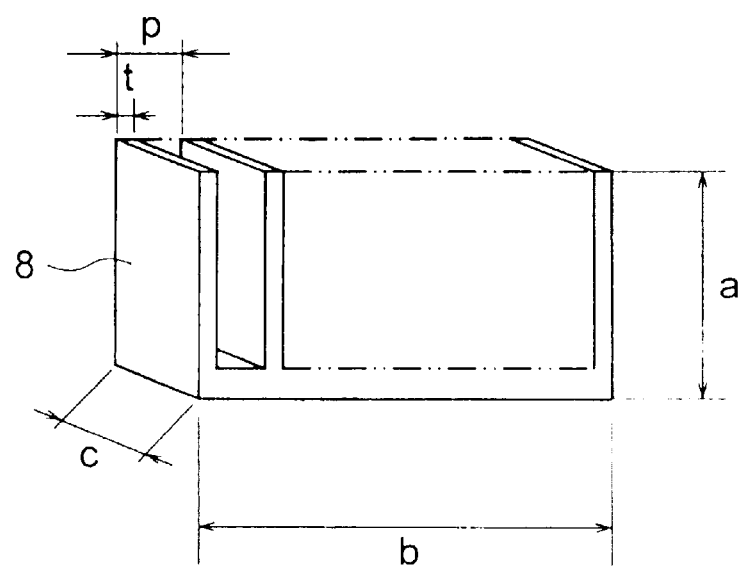
FIG. 9 is a perspective view showing the heat-radiating part of the heat sink used in the embodiments.

By the heat sink manufacturing device and manufacturing method of this invention, heat-radiating fins were formed so as to have a fin height a of 50 mm, length b of 100 mm, and side (depth) c of 20 mm, as shown in FIG. 9. At this time we investigated the fins' width [thickness] t and pitch [spacing] P. The fin width t was 0.7 mm at the end, 1.4 mm at the base, and 1.0 mm on average. The pitch P was 3 mm. The total surface area of the fins was 0.066 m².

The thermal resistance of heat-radiating fins formed in this way was 0.918° C. /w when measured at ADC 12 and a wind speed of 0.7 m/s. "ADC 12" means the ADC 12 of the 12 types of aluminum-alloy diecasts prescribed in JIS (Japan Industrial Standard) H 5302. Its chemical composition is as follows. Cu: 1.5–3.5, Si: 9.6–12.0, Mg: 0.3 or less, Zn: 1.0 or less, Fe: 1.3 or less, Mn: 0.5 or less, Ni: 0.5 or less, Sn: 0.3 or less, Al: the remainder.

For comparison, heat-radiating fins consisting of fin height a of 50 mm, length b of 100 mm, and side (depth) c of 20 mm as shown in FIG. 9 were formed by the conventional heat sink manufacturing device and manufacturing method as in the case of this invention, and the fin width t and pitch P were investigated. As a result, the fin width t was 0.7 mm at the end, 2.4 mm at the base, and 1.5 mm on average. For the pitch P, 6 mm was the limit; cracking, etc. occurred when it was less than this. The total surface area of the fins was 0.032 m².

The thermal resistance of heat-radiating fins formed in this way was 1.727° C. /w when measured, in the same way as with this invention, at ADC 12 and a wind speed of 0.7 m/s.

As is clear from the foregoing, the pitch P with the heat sink manufacturing device and manufacturing method of the present invention is 3 mm, which is ½ of what it is conventionally, while with the conventional heat sink manufacturing device and manufacturing method it is impossible to make it narrower than 6 mm. As a result, it is possible to provide a heat sink manufacturing device and manufacturing method by which one can manufacture a heat sink whose surface area is approximately doubled, whose thermal resistance is set smaller, and whose thermal efficiency is superior.

Also, with the conventional heat sink manufacturing device and manufacturing method it is impossible to produce anything other than heat-radiating fins of a simple shape as shown in FIG. 9. However, with the heat sink manufacturing device and manufacturing method of this invention, one can form fins of a variety of shapes in both the vertical and horizontal directions. As a result, the total surface area is increased by about 13% over the case shown in the inventive example if one uses fins of the shape pictured in FIG. 7, and the total surface area is increased by about 15% over the case shown in the inventive example if one uses fins of the shape pictured in FIG. 8, thus providing a device and method for manufacturing a heat sink of excellent heat-radiating efficiency.

As stated above, the present invention provides a device and method for manufacturing a heat sink that has fins of various shapes, has the prescribed strength, has high heat-radiating efficiency, and whose base and heat-radiating fins are formed integrally.

What is claimed is:

1. A heat sink manufacturing method comprising the steps of:

providing a die casting machine which has a cavity for a heat sink to be formed, said cavity consisting of a first cavity for a base and a second cavity for heat-radiating fins of the heat sink, and said die casting machine including a fixed mold, a movable mold that is movable in a first direction, and a slide mold that is movable in a second direction that is substantially perpendicular to said first direction;

arranging molds of said die casting machine such that said first cavity for the base is formed by said fixed mold and said movable mold that is movable in the up-down direction, and said second cavity for the heat radiating fins is formed by said fixed mold, said movable mold that is movable in the up-down direction, and said slide mold;

injecting molten metal into said first and second cavities and cooling said metal to a prescribed temperature whereby the base and the heat-radiating fins are formed in the first and second cavities respectively; and moving said movable mold up-down and moving said slide mold in a direction that is substantially perpendicular to the direction of movement of said movable mold, to thereby manufacture the base and heat-radiating fins and in their entirety.

2. The manufacturing method as described in claim 1, wherein said first direction is the up-down direction, and said second direction is the horizontal direction.

3. The heat sink manufacturing method as described in claim 2, wherein said slide mold is prepared to have at least two parts that extend in the horizontal direction and are separate from each other.

4. The heat sink manufacturing method as described in claim 3, wherein said parts that extend in the horizontal direction and are separate from each other are parts of polygonal cylinder shape.

5. The heat sink manufacturing method as described in claim 3, wherein said parts that extend in the horizontal direction and are separate from each other include at least two curved parts.

6. The heat sink manufacturing method as described in claim 3, wherein said slide mold is a lattice shape in a vertical cross-section thereof.

7. The heat sink manufacturing method as described in claim 3, wherein said slide mold has multiple parallel waveform shapes in a vertical direction thereof.

8. The heat sink manufacturing method as described in claim 1, wherein said heat sink is made to have a heat pipe.

9. The heat sink manufacturing method as described in claim 2, wherein first, said movable mold is moved up-down, and next, said slide mold is moved in the horizontal direction.

10. The heat sink manufacturing method as described in claim 2, wherein first said slide mold is moved in the horizontal direction, and next, said movable mold is moved up-down.

* * * * *